United States Patent [19]

Banjo et al.

[11] Patent Number: 4,905,124
[45] Date of Patent: Feb. 27, 1990

[54] IC CARD

[75] Inventors: Toshinobu Banjo; Shigeo Onoda; Makoto Omori, all of Itami, Japan

[73] Assignee: Mitsubishi Denki Kabushiki Kaisha, Japan

[21] Appl. No.: 174,955

[22] Filed: Mar. 29, 1988

[30] Foreign Application Priority Data

Mar. 31, 1987 [JP] Japan .................................. 62-79923

[51] Int. Cl.⁴ .............................................. H05K 1/14
[52] U.S. Cl. ..................... 361/395; 361/392; 361/394; 361/426
[58] Field of Search .................... 361/380, 392–395, 361/399, 413, 426

[56] References Cited

U.S. PATENT DOCUMENTS

| | | | |
|---|---|---|---|
| 3,529,213 | 9/1970 | Farrand et al. | 361/394 |
| 4,533,976 | 8/1985 | Suwa | 361/395 |
| 4,668,873 | 5/1987 | Ohba et al. | 361/395 |
| 4,772,762 | 9/1988 | Fukino | 174/68.5 |

OTHER PUBLICATIONS

"Electronics Makers Particulate in the IC Card Market", Nikkei Electronics, vol. II, Dec. 1985.

Primary Examiner—Gregory D. Thompson
Attorney, Agent, or Firm—Leydig, Voit & Mayer

[57] ABSTRACT

An IC card having a circuit board provided with wiring formed on at least one of two surfaces of the circuit board, a terminal base fixed to one surface of a front portion of the circuit board and having a multiplicity of electrode terminals disposed on its upper surface, a plurality of electronic parts mounted on the two surfaces of the circuit board, and a package in which the circuit board on which the electronic parts are mounted is incorporated while exposing the electrode terminals to the outside of the package.

5 Claims, 1 Drawing Sheet

IC CARD

BACKGROUND OF THE INVENTION

This invention relates to an IC card such as one used as a game-program card and, more particularly, to the high-density packaging of electronic parts therein.

The type of IC card that is used for TV games software or as a memory card for use in a computer system has a structure such as that shown in FIGS. 1 and 2 in plan and in section. As shown in FIGS. 1 and 2, a package 1 accommodates a semiconductor device 1a having a circuit board 5 and electronic parts 6 mounted thereon, and is constituted by a frame 2 which forms side peripheral portions of the package, and upper and lower covers 3 and 4 which are attached to upper and lower sides of the frame 2 to close the package. The frame 2 and the covers 3 and 4 are made of an insulating material such as a synthetic resin, or the upper and lower covers 3 and 4 may be metallic covers having surfaces coated with an insulating material. Electronic parts 6 including semiconductor elements and electric circuit parts are mounted on the lower surface of the circuit board 5 provided with printed wiring (not shown). A multiplicity of electrode terminals 7 are directly disposed on the upper surface of a front portion of the circuit board 5. The circuit board 5 is accommodated in the package 1.

Thus, the electrode terminals 7 are directly disposed on the upper surface of the circuit board 5 while the electronic parts 6 are mounted on the lower surface of the circuit board, and, correspondingly, the circuit board 5 is disposed close to the upper cover 3 so that the electrode terminals 7 are exposed to the outside of the package 1.

In the above-described conventional IC card, the electronic parts can be mounted on the lower surface of the circuit board 5 alone and, therefore, it is not possible to increase packing density.

SUMMARY OF THE INVENTION

The present invention has been achieved with a view to overcoming this problem, and an object of the present invention is to provide an IC card in which electronic parts are mounted on a circuit board at high density.

To this end, the present invention provides an IC card in which a terminal support member on which electrode terminals are disposed and which has greater height than the electronic parts is fixed to the upper surface of a front-end portion of the circuit board, the circuit board is spaced apart from the upper plate by a distance corresponding to the height of the terminal support member, in other words, the circuit board is disposed near the center of the package, and electronic parts are mounted on both upper and lower surfaces of the circuit board.

In accordance with the present invention, the upper surface of the circuit board is spaced apart from the upper plate so that electronic parts can be mounted on the upper surface of the circuit board as well as the lower surface thereof, thereby enabling high-density packaging.

DESCRIPTION OF THE PREFERRED EMBODIMENT

Figure 1:
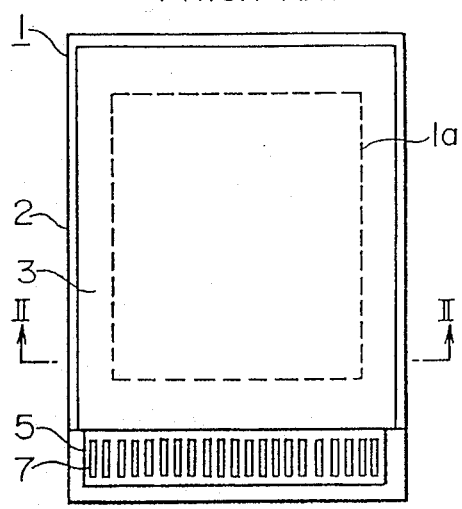
FIG. 1 is a plan view of a conventional IC card.
Figure 3:
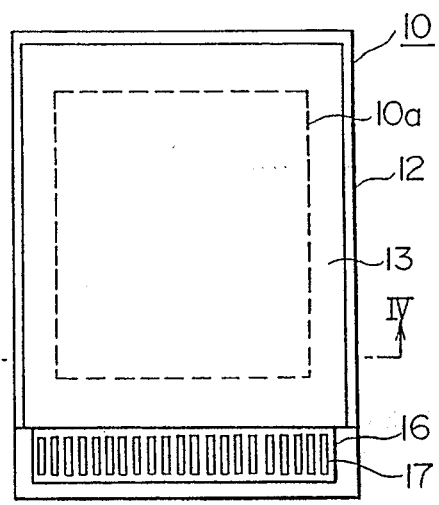
FIG. 3 is a plan view of an IC card in accordance with the present invention.
Figure 2:
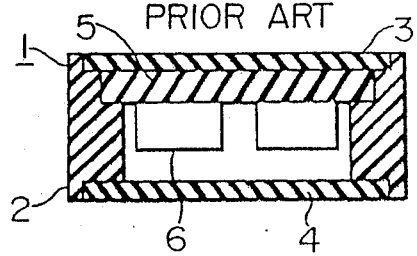
FIG. 2 is a sectional view of the IC card shown in FIG. 1.
Figure 4:
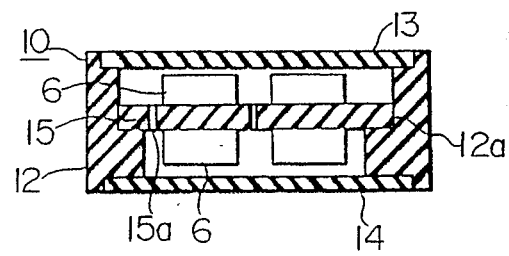
FIG. 4 is a sectional view of the IC card shown in FIG. 3.
Figure 5:
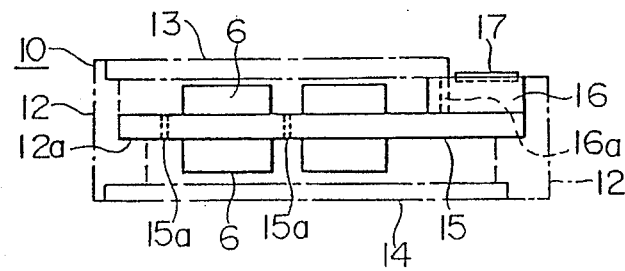
FIG. 5 is a schematic side view showing an internal structure of the IC card of FIG. 3.

FIGS. 3 and 4 show in plan and in section an IC card which represents an embodiment of the present invention. A package 10 which accommodates a semiconductor device 10a is constituted by a frame 12 and upper and lower covers 13 and 14. These members are made of the same materials as those of the conventional IC card. The frame 12 has internal receiving portions 12a which are formed on inner walls of the frame 12 along the inner periphery thereof. A circuit board 15 is supported on or bonded by an adhesive to the upper surfaces of the receiving portions 12a. The circuit board 15 is provided with circuit wiring (not shown) such as printed wiring formed on one or two sides thereof. Electronic parts 6 are mounted on both surfaces of the circuit board 15. These electronic parts 6 can be connected to each other via through holes 15a formed in the circuit board 15. A terminal support member 16 (FIG. 5) having a thickness greater than the heights of the electronic parts 6 is fixed to the upper surface of a front-end portion of the circuit board 15 and a multiplicity of electrode terminals 17 are disposed on the upper surface of the terminal support base 16. FIG. 5 is a view of the circuit board 15 in which the package 10 is indicated by the dashed lines. The multiplicity of electrode terminals 17 that are disposed on the upper surface of the terminal support base 16 fixed to the upper surface of the circuit board 15 are connected to the wiring formed on the circuit board 15. Terminal support base 16 includes a plurality of through holes 16a through which terminals 17 are electrically connected to the wiring on circuit board 15. This structure in accordance with the present invention, in which the terminal support base 16 having a desired height is fixedly mounted on the circuit board 15 and in which the electrode terminals 17 are disposed on the upper surface of the terminal support member 16, enables the circuit board 15 to be lowered from the level at which the electrode terminals 17 should be disposed, and to be spaced apart from the upper cover 13. The space thereby formed between the upper cover 13 and the circuit board 15 is used to accommodate some electronic parts 6 mounted on the upper surface of the circuit board 15. The electronic parts are thus mounted on the upper and lower surfaces of the circuit board, thereby enabling high-density packaging and an increase in the capacity of the IC card while maintaining the card in substantially the same size and shape as a conventional IC card.

What is claimed is:

1. An IC card comprising:
   a circuit board having two opposed surfaces and electrical wiring disposed on at least one of said surfaces, said circuit board including an exposed edge along which electrode terminals for connection of said circuit board to an external device are disposed;
   a plurality of electronic parts mounted on said surfaces;

a package including a frame enclosing part of said circuit board, first and second covers disposed on said frame to enclose said circuit board while leaving said electrode terminals exposed, said frame including an internal portion on which said circuit board is mounted intermediate of said first and second covers; and a terminal base mounted on one of said surfaces, said electrode terminals being disposed on said terminal base spaced from said circuit board for positioning said electrode terminals relative to said first cover.

2. An IC card according to claim 1 wherein said circuit board is bonded to said frame.

3. An IC card according to claim 1 wherein said terminal base includes through holes through which said electrode terminals are electrically connected to said electrical wiring disposed on said circuit board.

4. An IC card according to claim 1, wherein said circuit board includes through holes for electrically connecting said electronic parts mounted on said surfaces of said circuit board.

5. An IC card according to claim 4 wherein said terminal base includes through holes through which said electrode terminals are electrically connected to said electrical wiring disposed on said circuit board.

* * * * *